United States Patent
Huang

(10) Patent No.: US 6,870,274 B2
(45) Date of Patent: Mar. 22, 2005

(54) FLASH-PREVENTING WINDOW BALL GRID ARRAY SEMICONDUCTOR PACKAGE, METHOD FOR FABRICATING THE SAME, AND CHIP CARRIER USED IN THE SEMICONDUCTOR PACKAGE

(75) Inventor: Chien-Ping Huang, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/618,011

(22) Filed: Jul. 11, 2003

(65) Prior Publication Data

US 2004/0227234 A1 Nov. 18, 2004

(30) Foreign Application Priority Data

May 13, 2003 (TW) ........................................ 92112881 A

(51) Int. Cl.$^7$ ................................................ H01L 23/48
(52) U.S. Cl. ........................ 257/780; 257/774; 257/782; 257/784
(58) Field of Search ................................ 257/780, 782, 257/784, 787, 774

(56) References Cited

U.S. PATENT DOCUMENTS

| 6,048,755 A | 4/2000 | Jiang et al. | 438/118 |
| 6,190,943 B1 | 2/2001 | Lee et al. | 438/107 |
| 6,218,731 B1 | 4/2001 | Huang et al. | 257/738 |
| 6,326,700 B1 | 12/2001 | Bai et al. | 257/790 |
| 6,385,049 B1 * | 5/2002 | Chia-Yu et al. | 361/721 |
| 6,528,722 B2 * | 3/2003 | Huang et al. | 174/52.2 |
| 6,661,099 B2 * | 12/2003 | Sasaki | 257/784 |
| 2002/0100989 A1 * | 8/2002 | Jiang et al. | 257/784 |
| 2004/0061239 A1 * | 4/2004 | Bai | 257/782 |

* cited by examiner

*Primary Examiner*—Jasmine Clark
(74) *Attorney, Agent, or Firm*—Peter F. Corless; Steven M. Jensen; Edwards & Angell, LLP

(57) ABSTRACT

A flash-preventing window ball grid array semiconductor package, a method for fabricating the same, and a chip carrier used in the semiconductor package are provided. The chip carrier has a through hole and has a surface formed with a plurality of wire-bonding portions, ball-bonding portions and intended-exposing regions. A chip is mounted over the through hole and electrically connected to the wire-bonding portions by a plurality of bonding wires penetrating through the through hole. An encapsulation body encapsulates the chip and bonding wires. The intended-exposing regions serve as a narrow runner which is filled with an encapsulating material forming the encapsulation body, making the encapsulating material not flash over the ball-bonding portions. This allows a plurality of solder balls to be well bonded to the ball-bonding portions, thereby assuring the quality of electrical connection and the surface planarity of the semiconductor package.

15 Claims, 7 Drawing Sheets

FLASH-PREVENTING WINDOW BALL GRID ARRAY SEMICONDUCTOR PACKAGE, METHOD FOR FABRICATING THE SAME, AND CHIP CARRIER USED IN THE SEMICONDUCTOR PACKAGE

FIELD OF THE INVENTION

The present invention relates to semiconductor packages and fabrication methods thereof, and more particularly, to a window ball grid array (WBGA) semiconductor package which can prevent the occurrence of resin flash and assure the quality of electrical connection, and a method for fabricating the semiconductor package, as well as a chip carrier used in the semiconductor package.

BACKGROUND OF THE INVENTION

A conventional window ball grid array (WBGA) semiconductor package uses a substrate having at least one through hole penetrating therethrough to allow a chip to be mounted on a surface of the substrate and over the through hole. A plurality of bonding wires go through the through hole and electrically connect the chip to the substrate. A plurality of solder balls are formed on a surface opposite to the chip-mounting surface of the substrate to electrically connect the chip to an external electronic device. This WBGA structure desirably shortens the bonding wires used for a central-pad type of chip, thereby reducing resistance of signal transmission and improving electrical performance and overall thickness of the semiconductor package.

The above conventional WBGA structure is shown in FIG. 5A, comprising a substrate 80 having an upper surface 81 and a lower surface 82, and a through hole 83 penetrating through the substrate 80. A plurality of conductive traces formed on the lower surface 82 of the substrate 80 are predefined with a plurality of wire-bonding regions 84 and ball-bonding regions 85. A chip 86 is mounted in a face down manner to allow its active surface 86a to be disposed on the upper surface 81 of the substrate 80 and over one end of the through hole 83, such that bond pads 87 of the chip 86 can be exposed via the through hole 83 and electrically connected to the corresponding wire-bonding regions 84 on the lower surface 82 of the substrate 80 by a plurality of bonding wires 88 going through the through hole 83. Then, a first encapsulation body 90 and a second encapsulation body 91 are respectively formed on the first surface 81 and the second surface 82 of the substrate 80, wherein the first encapsulation body 90 encapsulates the chip 86, and the second encapsulation body 91 is filled into the through hole 83 and encapsulates the bonding wires 88. Finally, a plurality of solder balls 92 are deposited on the ball-bonding regions 85 which are not encapsulated by the second encapsulation body 91, and the solder balls 92 serve as input/output (I/O) connections to electrically connect the chip 86 to an external printed circuit board (not shown). The relevant prior art references include U.S. Pat. Nos. 6,048,755, 6,190,943, 6,218,731, and 6,326,700, to name just a few, which relate to the WBGA package technology advantageously having more preferable electrical performance and compact size.

Besides the above mentioned benefits, however, the WBGA package undesirably renders a yield issue. In particular, for fabricating the first encapsulation body 90 and second encapsulation body 91, as shown in FIG. 5B, an encapsulation mold 95 having an upper mold 93 and a low mold 94 is used. The lower mold 94 is formed with a lower mold cavity 94a having a predetermined shape, unlike the one having a flat surface and used for a normal BGA package. During a molding or encapsulation process, the die-bonded and wire-bonded substrate 80 is placed in the encapsulation mold 95 and clamped between the upper and lower molds 93, 94. An epoxy resin material is injected into the encapsulation mold 95, wherein the epoxy resin is filled in an upper mold cavity 93a of the upper mold 93 to form the first encapsulation body 90 that encapsulates the chip 86, and filled in the lower mold cavity 94a of the lower mold 94 to form the second encapsulation body 91 that encapsulates the bonding wires 88. However, due to different sizes and clamping positions of the upper mold cavity 93a and lower mold cavity 94a, further as shown in FIG. 5B, non-clamping (NC) areas on the lower surface 82 of the substrate 80 are only supported by the lower mold 94 but not subject to a clamping force from the upper mold 93, such that the NC areas cannot be sufficiently and strongly clamped by the encapsulation mold 95 during molding, making the injected epoxy resin for fabricating the second encapsulation body 91 flash over the lower surface 82 of the substrate 80, as shown in FIGS. 5C and 5D (FIG. 5C is a cross-sectional view of FIG. 5D taken along the line 5C—5C). This resin flash f not only damages the surface planarity and external appearance of the semiconductor package, but also possibly contaminates the ball-bonding regions 85 predefined on the second surface 82 of the substrate 80, making the solder balls 92 fail to be perfectly bonded to the substrate 80 and thus adversely affecting the quality of electrical connection of the semiconductor package.

Therefore, the problem to be solved herein is to provide a WBGA semiconductor package which can eliminate the resin flash to thereby improve the quality of electrical connection and assure the surface planarity as well as provide a clean appearance for the semiconductor package.

SUMMARY OF THE INVENTION

An objective of the present invention is to provide a flash-preventing window ball grid array (WBGA) semiconductor package, a method for fabricating the semiconductor package, and a chip carrier used in the semiconductor package, which can assure the quality of electrical connection.

Another objective of the present invention is to provide a flash-preventing WBGA semiconductor package, a method for fabricating the semiconductor package, and a chip carrier used in the semiconductor package, which can improve the surface planarity of the semiconductor package.

A further objective of the present invention is to provide a flash-preventing WBGA semiconductor package, a method for fabricating the semiconductor package, and a chip carrier used in the semiconductor package, which can provide a clean and satisfactory appearance for the semiconductor package.

In accordance with the above and other objectives, the present invention proposes a method for fabricating a flash-preventing WBGA semiconductor package, comprising the steps of: preparing a core layer, the core layer having a first surface and an opposite second surface, and a through hole penetrating through the core layer, wherein the second surface is formed with a plurality of wire-bonding portions around the through hole, a plurality of ball-bonding portions, and a plurality of intended-exposing regions around the wire-bonding portions; applying a solder mask layer over the second surface of the core layer while exposing the ball-bonding portions, wherein the solder mask layer is formed with an opening for exposing the through hole, the wire-bonding portions, and the intended-exposing regions; preparing at least one chip which is mounted on the first surface of the core layer and over the through hole, with a portion of the chip exposed via the through hole; forming a plurality of bonding wires which penetrate through the through hole and electrically connect the chip to the wire-bonding portions; performing a molding process to form a first encapsulation body on the first surface of the core layer to encapsulate the chip, and a second encapsulation body on the second surface of the core layer to encapsulate the bonding wires, wherein the intended-exposing regions serve as a narrow runner for an encapsulating material forming the second encapsulation body; and depositing a plurality of solder balls on the ball-bonding portions.

The flash-preventing WBGA semiconductor package fabricated by the above method comprises: a core layer having a first surface and an opposite second surface, and a through hole penetrating through the core layer, wherein the second surface is formed with a plurality of wire-bonding portions around the through hole, a plurality of ball-bonding portions, and a plurality of intended-exposing regions around the wire-bonding portions; at least one chip mounted on the first surface of the core layer and over the through hole, with a portion of the chip exposed via the through hole; a solder mask layer applied over the second surface of the core layer with the ball-bonding portions being exposed, wherein the solder mask layer is formed with an opening for exposing the through hole, the wire-bonding portions, and the intended-exposing regions; a plurality of bonding wires which penetrate through the through hole and electrically connect the chip to the wire-bonding portions; a first encapsulation body formed on the first surface of the core layer for encapsulating the chip; a second encapsulation body formed on the second surface of the core layer for encapsulating the bonding wires and the intended-exposing regions; and a plurality of solder balls deposited on the ball-bonding portions.

Moreover, a chip carrier used in the above flash-preventing WBGA semiconductor package comprises: a core layer having a first surface and an opposite second surface, and a through hole penetrating through the core layer; a conductive trace layer applied over the second surface of the core layer, and formed with a plurality of wire-bonding portions around the through hole, a plurality of ball-bonding portions, and a plurality of intended-exposing regions around the wire-bonding portions; and a solder mask layer applied over the conductive trace layer with the ball-bonding portions being exposed, and formed with an opening for exposing the through hole, the wire-bonding portions, and the intended-exposing regions.

The intended-exposing region has a width of a range from 0.2 to 0.8 mm and preferably 0.4 mm. The intended-exposing regions are located adjacent to the wire-bonding portions. The opening of the solder mask layer is adapted to be slightly larger in width than a mold cavity of a mold used for forming the second encapsulation body. The intended-exposing regions, an edge of the solder mask layer, and a surface of the mold encompass a narrow runner for an encapsulating material forming the second encapsulation body.

Therefore, during the molding process, the encapsulating material forming the second encapsulation body encapsulates the bonding wires and is filled in the narrow runner, such that the second encapsulation body covering the intended-exposing regions has a substantially equal thickness to that of the solder mask layer. As the encapsulating material is a viscous fluid having a low Reynolds number, when it enters into the constricted narrow runner, according to the fluid mechanics, the encapsulating material or viscous fluid would have its viscosity increased and its flow speed reduced, such that the encapsulating material stops its motion within the narrow runner without flashing into an interface between the solder mask layer and the surface of the mold or over the ball-bonding portions, thereby eliminating the occurrence of resin flash and assuring the quality of electrical connection of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a flash-preventing window ball grid array (WBGA) semiconductor package and a method for fabricating the semiconductor package proposed in the present invention are described with reference to FIGS. 1, 2A–2B, 3, and 4A–4F.

Figure 1:
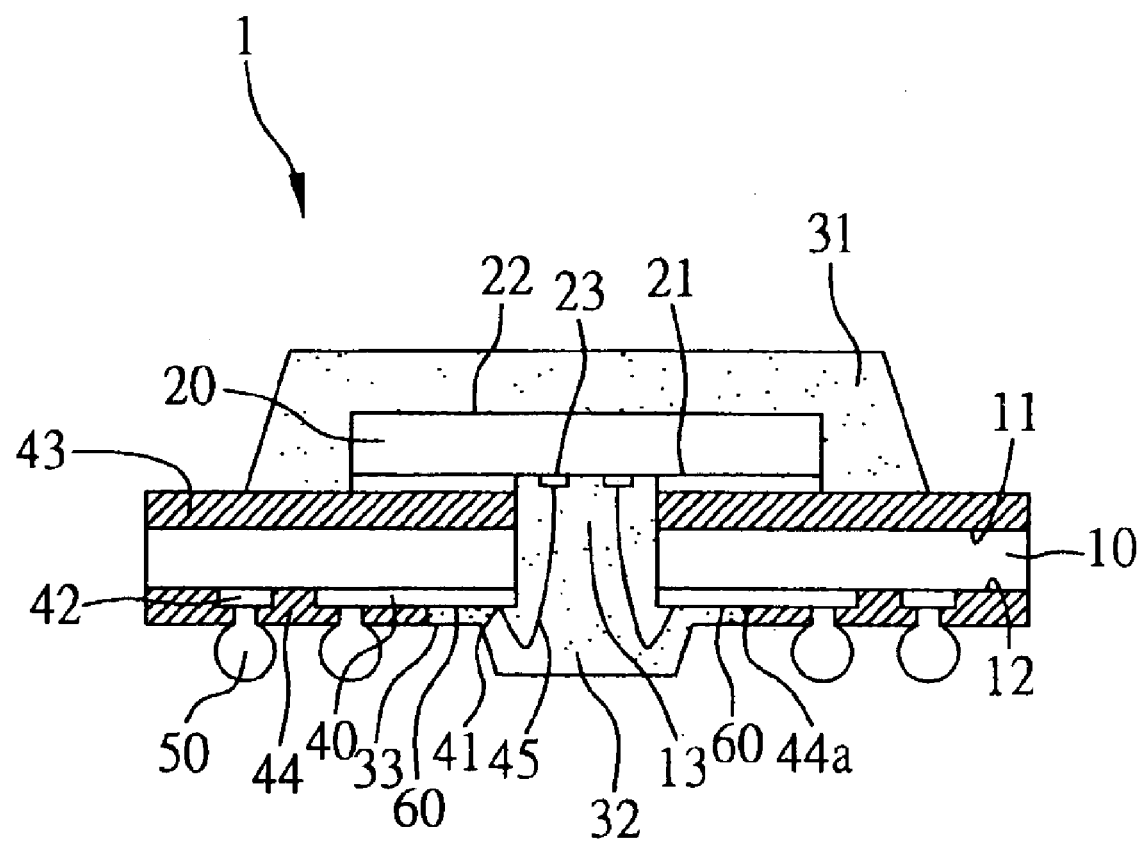
FIG. 1 is a schematic diagram showing a cross-sectional view of a window ball grid array (WBGA) semiconductor package according to a preferred embodiment of the invention.

FIG. 1 shows a cross-sectional view of the WBGA semiconductor package 1 according to a preferred embodiment of the invention, comprising: a substrate or core layer 10 having a first surface 11 and an opposite second surface 12; a chip 20 mounted on the substrate 10 and having an active surface 21 and an inactive surface 22; first and second encapsulation bodies 31, 32 formed on the first surface 11 and the second surface 12 of the substrate 10 respectively; and a plurality of solder balls 50 deposited on the second surface 12 of the substrate 10. In more detail, a through hole 13 is formed at the center of the substrate 10 and penetrates through the substrate 10. A plurality of conductive traces 40 are formed on the second surface 12 of the substrate 10 and defined with a plurality of wire-bonding portions 41 and ball-bonding portions 42. The plurality of wire-bonding portions 41 are located around the through hole 13, and the plurality of ball-bonding portions 42 for bonding the solder balls 50 are arranged in an array around the wire-bonding portions 41. Further, the active surface 21 of the chip 20 is mounted on the first surface 11 of the substrate 10 and over one end of the through hole 13, to allow a conductive area 23 to be exposed via the through hole 13. A plurality of bonding wires 45 penetrate through the through hole 13 and electrically connect the conductive area 23 to the wire-bonding portions 41 of the conductive traces 40. Moreover, the first encapsulation body 31 is formed on the first surface 11 of the substrate 10 for encapsulating the chip 20. The second encapsulation body 32 is formed on the second surface 12 of the substrate 10 for encapsulating the bonding wires 45, while allowing the plurality of solder balls 50 to be deposited on the ball-bonding portions 42 which are not encapsulated by the second encapsulation body 32.

Figure 3:
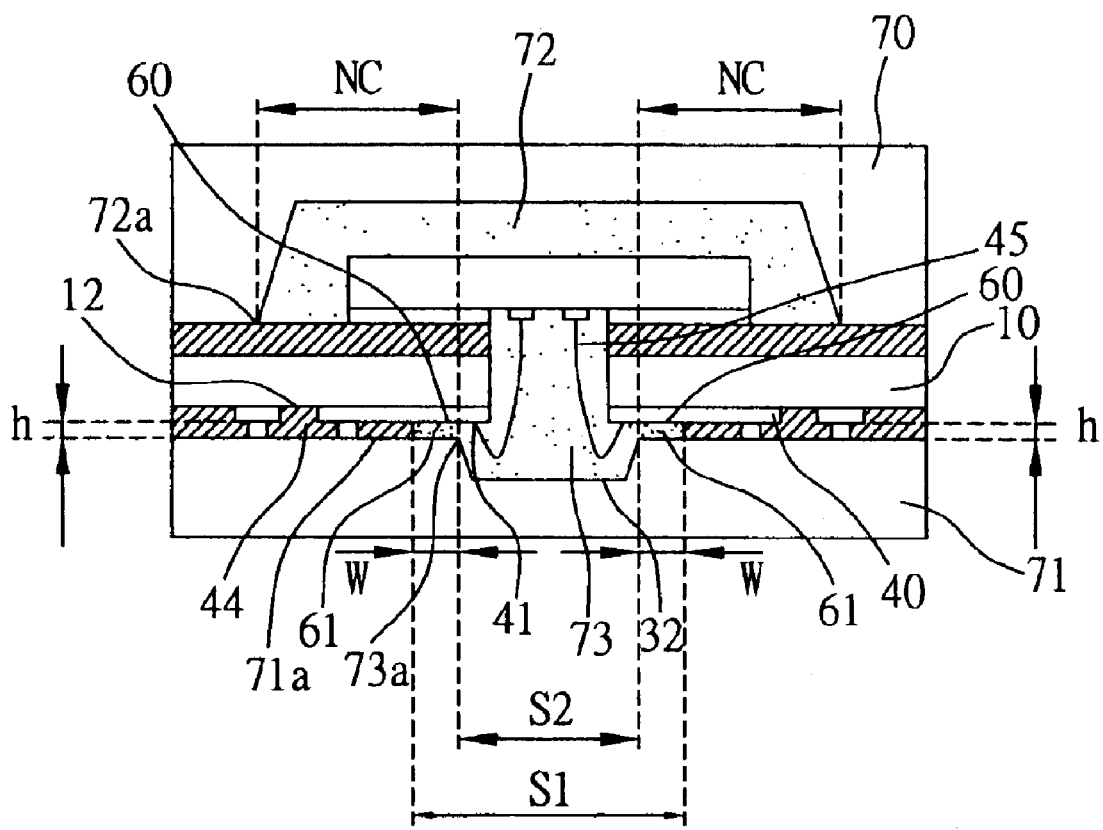
FIG. 3 is a schematic diagram showing a cross-sectional view of the WBGA semiconductor package according to the invention during the molding process.

As shown in FIG. 1, a first solder mask layer 43 and a second solder mask layer 44 are respectively applied over the first surface 11 and the second surface 12 of the substrate 10. The chip 20 is mounted on the first solder mask layer 43, and the first encapsulation body 31 encapsulates entirely the chip 20 and the first solder mask layer 43. The second solder mask layer 44 is coated on the conductive traces 40 and formed with a plurality of array-arranged apertures for exposing the ball-bonding portions 42 which are allowed to bond the solder balls 50. And an opening 44a is formed at the center of the second solder mask layer 44 for exposing the through hole 13 of the substrate 10 and the wire-bonding portions 41 around the through hole 13. A width S1 of the opening 44a is slightly larger than a width S2 of a lower mold cavity 73 (as shown in FIG. 3) which is used for fabricating the second encapsulation body 32.

Figure 2A:
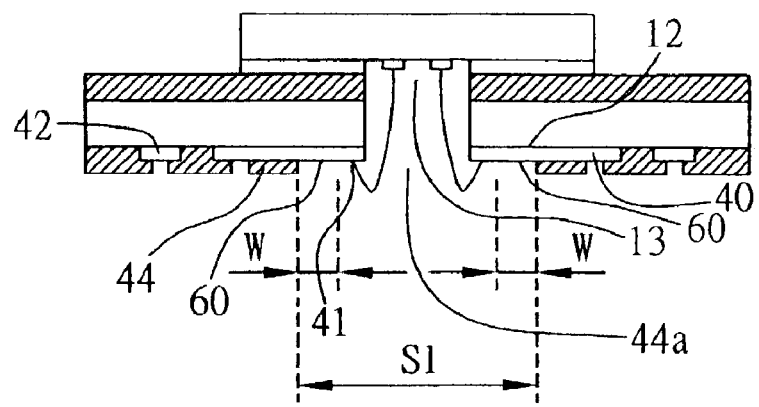
FIG. 2A is a schematic diagram showing a cross-sectional view of the WBGA semiconductor package according to the invention prior to a molding process.
Figure 2B:
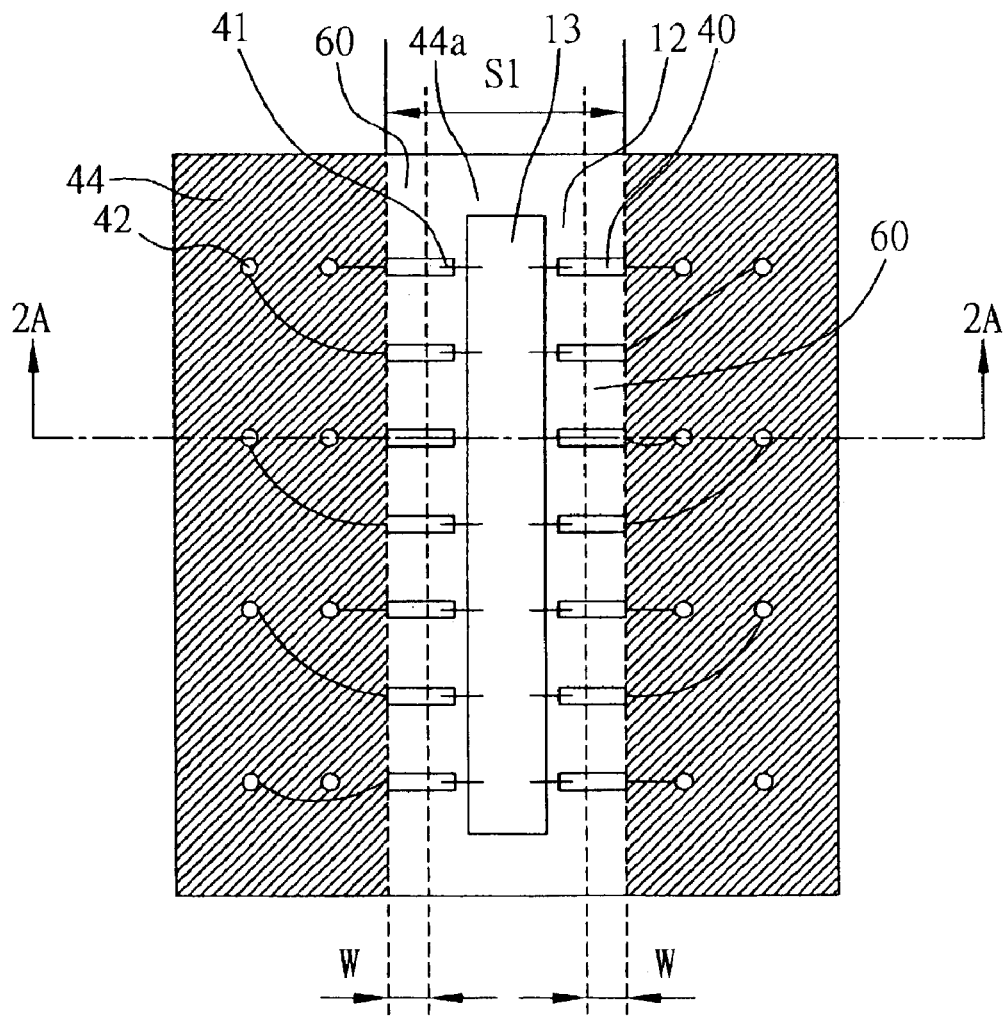
FIG. 2B is a schematic diagram showing a bottom view of the WBGA semiconductor package according to the invention prior to the molding process.
Figure 5A:
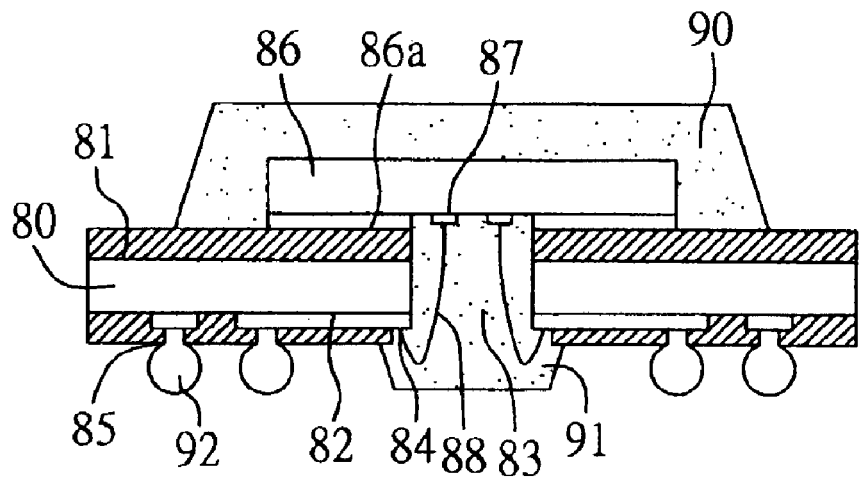
FIG. 5A (PRIOR ART) is a schematic diagram showing a cross-sectional view of a conventional WBGA semiconductor package.
Figure 5B:
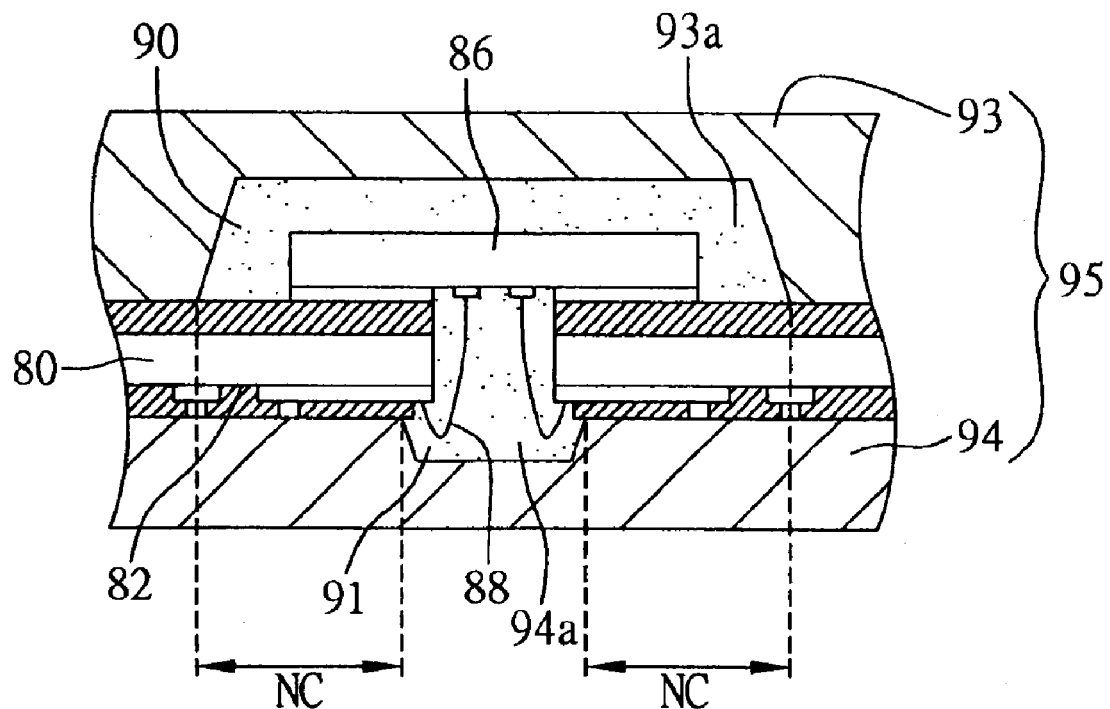
FIG. 5B (PRIOR ART) is a schematic diagram showing a cross-sectional view of the conventional WBGA semiconductor package during the molding process.

It is a characteristic feature of forming the specially dimensioned opening 44a through the second solder mask layer 44. As shown in FIGS. 2A and 2B (FIG. 2A is a cross-sectional view of FIG. 2B taken along the line 2A—2A), the width S1 of the opening 44a of the second solder mask layer 44 is larger than that in the prior art shown in FIG. 5B, so as to allow the through hole 13 of the substrate 10, the wire-bonding portions 41 around the through hole 13, and areas having a width w on the second surface 12 and around the wire-bonding portions 41, to be exposed outside of the second solder mask layer 44, wherein the exposed areas are interposed between the second solder mask layer 44 and the wire-bonding portions 41, and customarily referred to as intended-exposing regions 60 whose width w is approximately of a range from 0.2 to 0.8 mm and preferably 0.4 mm. As a result, the width S1 of the opening 44a of the second solder mask layer 44 is equal to the sum of widths of the through hole 13, the wire-bonding portions 41, and the intended-exposing regions 60.

The intended-exposing regions 60 are used to prevent the occurrence of resin flash on the second surface 12 of the substrate 10. As shown in FIG. 3, during a molding process, the substrate 10 is clamped by an upper mold 70 and a lower mold 71. Since a mold cavity edge 72a of the upper mold 70 is not aligned to a mold cavity edge 73a of the lower mold 71 that substantially corresponds to the wire-bonding portions 41, non-clamping (NC) areas on the second surface 12 of the substrate 10 are not subject to a clamping force from the upper mold 70. However, by the wider opening 44a of the second solder mask layer 44, each of the intended-exposing regions 60, the second solder mask layer 44, and a surface 71a of the lower mold 71 encompass a narrow short runner 61 which can be filled with an encapsulating material used for forming the second encapsulation body 32. The narrow short runner 61 has a length substantially equal to the width w of the intended-exposing region 60 and thus of a range from 0.2 to 0.8 mm and preferably 0.4 mm. And, the narrow short runner 61 has a height substantially equal to a thickness h of the second solder mask layer 44 which is of a range from 0.02 to 0.03 mm.

When the encapsulating material used for forming the second encapsulation body 32, such as a thermo-plastic or thermo-setting resin (e.g. polycarbonate ester, acrylic resin, or polyester resin), is injected into the lower mold cavity 73 of the lower mold 71 and encapsulates the bonding wires 45, it would enter and fill into the narrow short runners 61. As the encapsulating material is a viscous fluid having a low Reynolds number, according to the fluid mechanics, the encapsulating material or viscous fluid when entering into the narrow short runners 61 would increase its viscosity and reduce its flow speed, thus stopping its motion within the narrow short runners 61 without flashing into an interface between the second solder mask layer 44 and the surface 71a of the lower mold 71 or over the ball-bonding portions 42.

Figure 5C:
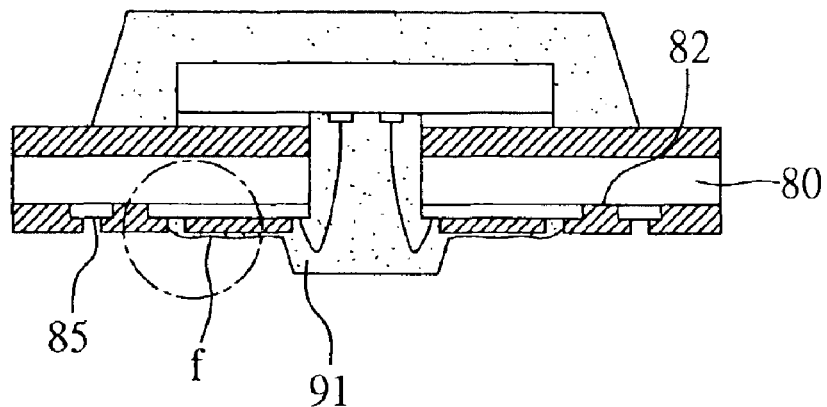
FIG. 5C (PRIOR ART) is a schematic diagram showing a cross-sectional view of the conventional WBGA semiconductor package during the molding process to form resin flash.
Figure 5D:
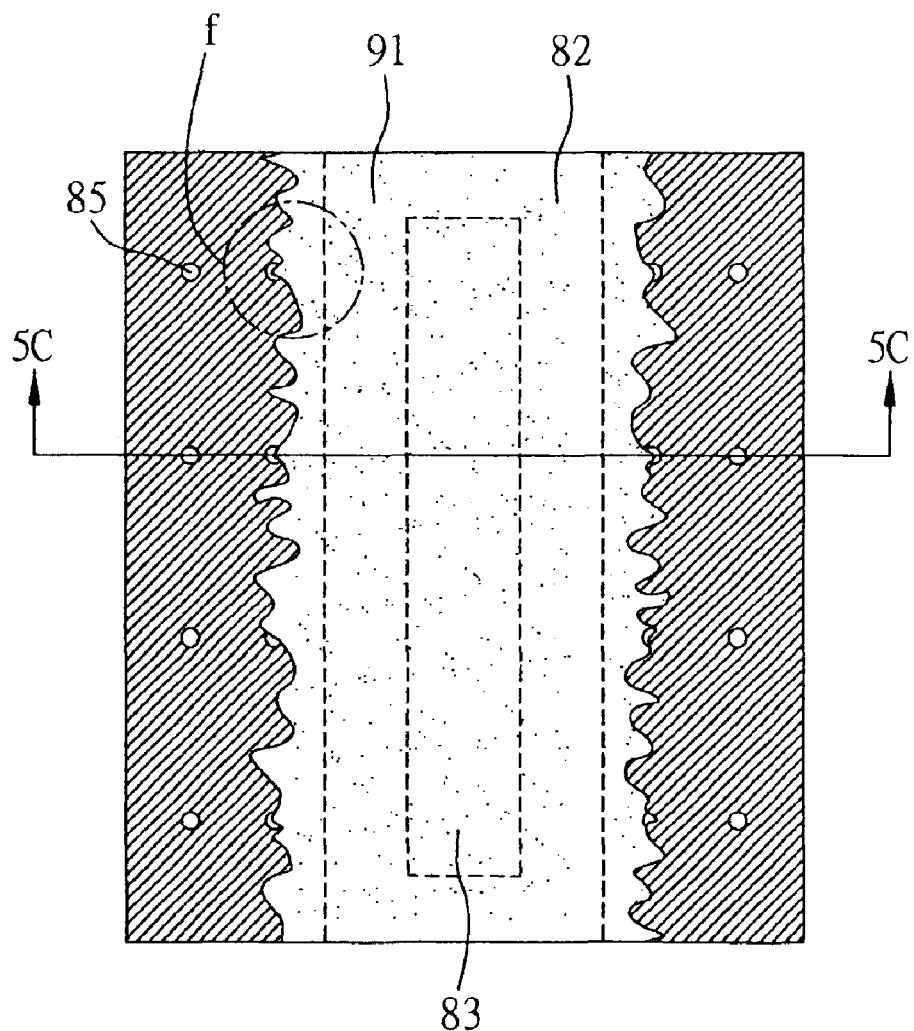
FIG. 5D (PRIOR ART) is a schematic diagram showing a bottom view of the conventional WBGA semiconductor package during the molding process to form resin flash.

After completing the molding process, the upper and lower molds 70, 71 are removed from the substrate 10, and then a ball bonding process is performed to deposit the plurality of solder balls 50 on the ball-bonding portions 42, such that the semiconductor package 1 shown in FIG. 1 is fabricated. The second encapsulation body 32 covering the intended-exposing regions 60 has a surface 33 substantially flush with an exposed surface of the second solder mask layer 44 and thus is advantage over the prior art shown in FIG. 5C as not flashing over the second solder mask layer 44.

Figure 4A:
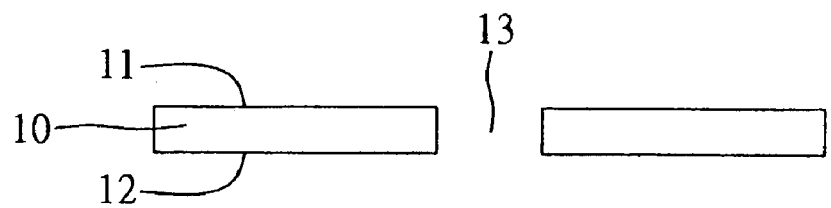
FIGS. 4A to 4F are schematic diagrams showing procedural steps for fabricating the WBGA semiconductor package according to the invention.
Figure 4B:
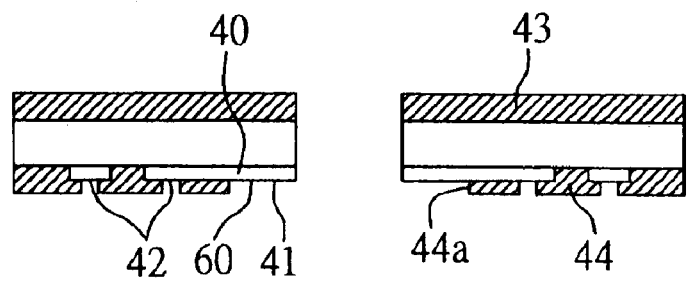
Figure 4C:
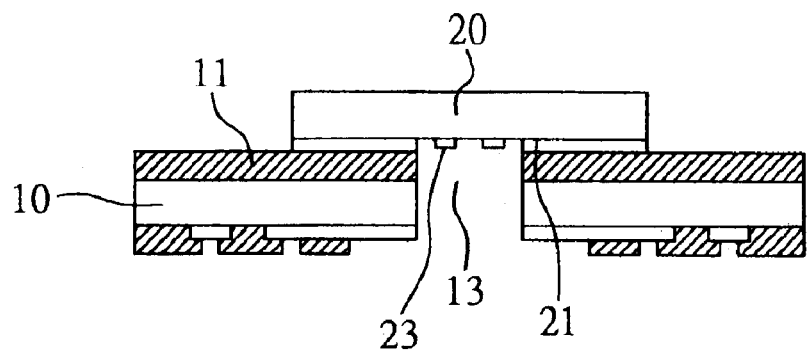
Figure 4D:
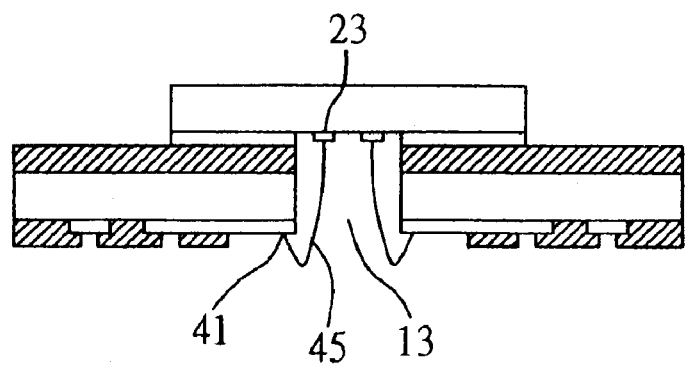
Figure 4E:
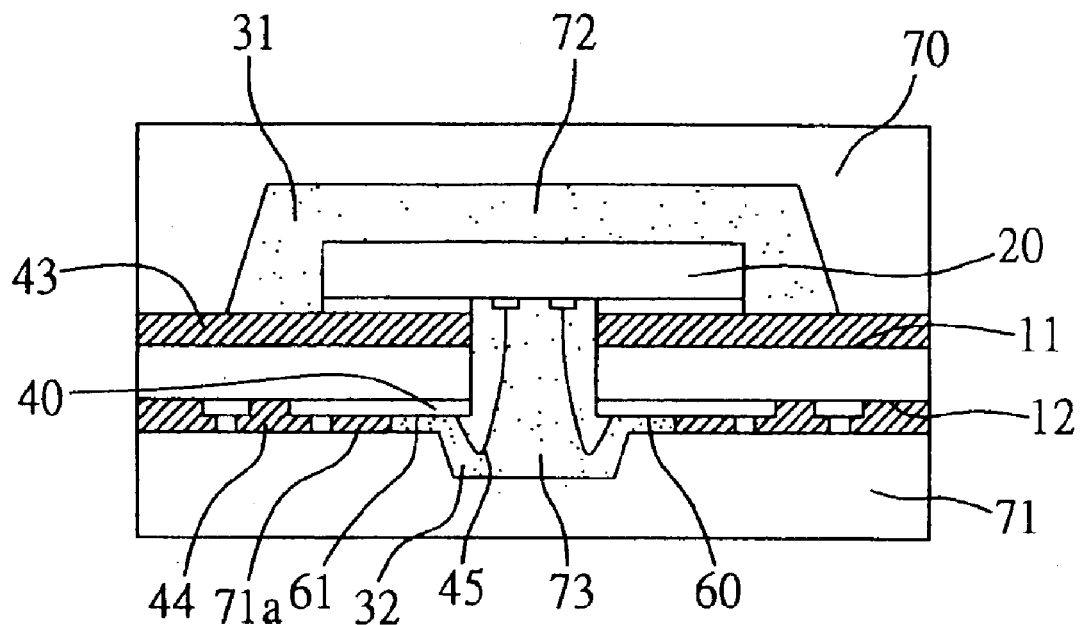
Figure 4F:
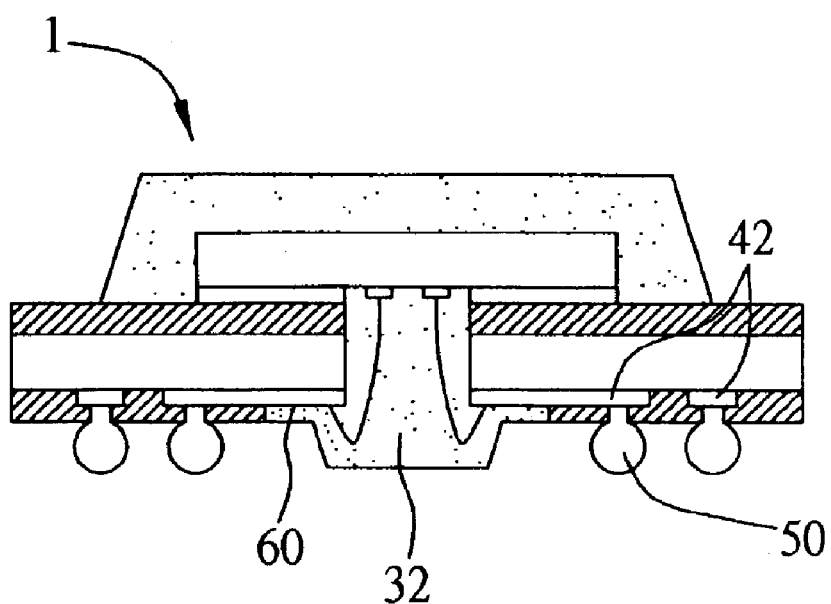

The above WBGA semiconductor package 1 can be fabricated by a series of procedural steps shown in FIGS. 4A to 4F. Referring to FIG. 4A, the first step is to prepare a substrate 10 having a first surface 11 and an opposite second surface 12, and a through hole 13 penetrating through the center of the substrate 10. Next, referring to FIG. 4B, a plurality of patterned conductive traces 40 are formed on the second surface 12 of the substrate 10 and defined with a plurality of ball-bonding portions 42, a plurality of wire-bonding portions 41 around the through hole 13, and a plurality of intended-exposing regions 60 around the wire-bonding portions 41. Then, a first solder mask layer 43 and a second solder mask layer 44 are applied over the first surface 11 of the substrate 10 and the conductive traces 40 respectively, wherein the first solder mask layer 43 has an opening for exposing the through hole 13 of the substrate 10, and the second solder mask layer 44 has a plurality of apertures for exposing the ball-bonding portions 42 and an opening 44a formed at a central position for exposing the through hole 13, the wire-bonding portions 41, and the intended-exposing regions 60. Subsequently, referring to FIG. 4C, a chip 20 is prepared and has its active surface 21 mounted on the first surface 11 of the substrate 10 and over one end of the through hole 13, allowing a conductive area 23 on the active surface 21 to be exposed via the through hole 13. Referring to FIG. 4D, a plurality of bonding wires 45 are formed through the through hole 13 to electrically connect the conductive area 23 of the chip 20 to the wire-bonding portions 41. Thereafter, referring to FIG. 4E, a molding process is performed during which the substrate 10 is clamped by an upper mold 70 and a lower mold 71, wherein the chip 20 and the first solder mask layer 43 are received in an upper mold cavity 72 of the upper mold 70, and the bonding wires 45 are received in a lower mold cavity 73 of the lower mold 71. An encapsulating material is injected into the upper mold cavity 72 and the lower mold cavity 73 to form a first encapsulation body 31 on the first surface 11 of the substrate 10 to encapsulate the chip 20, and a second encapsulation body 32 on the second surface 12 of the substrate 10 to encapsulate the bonding wires 45. Each the intended-exposing regions 60, the second solder mask layer 44, and a surface 71a of the lower mold 71 encompass a narrow runner 61 where the encapsulating material for forming the second encapsulation body 32 stops its motion without flashing out. Finally, when the encapsulation bodies 31, 32 are cured, the upper and lower molds 70, 71 are removed from the substrate 10, and as shown in FIG. 4F, a plurality of solder balls 50 are deposited on the ball-bonding portions 42, with the intended-exposing regions 60 being covered by the second encapsulation body 32, to thereby form the WBGA semiconductor package 1 according to the invention.

Therefore, by the provision of intended-exposing regions 60 which serve as the narrow runners 61 for confining the movement of the encapsulating material and preventing the second encapsulation body 32 from flashing to the ball-bonding portions 42 which are not subject to a clamping force from the upper mold 70. It should be understood that the location and size of the intended-exposing regions 60 or narrow runners 61 can be flexibly modified by altering the opening 44a of the second solder mask layer 44; for example, the opening 44a can be flexibly shaped as long as its width S1 slightly larger than the width S2 of the lower mold cavity 73 to form the intended-exposing regions 60 or narrow runners 61 having a width w around the wire-bonding portions 41.

In conclusion, the WBGA semiconductor package and its fabrication method according to the invention can desirably eliminate the occurrence of resin flash and thus improve the quality of electrical connection and performance as well as provide a clean and flat appearance for the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A window ball grid array (WBGA) semiconductor package, comprising:
   a core layer having a first surface and an opposite second surface, and a through hole penetrating through the core layer, wherein the second surface is formed with a plurality of wire-bonding portions around the through hole, a plurality of ball-bonding portions, and a plurality of intended-exposing regions around the wire-bonding portions;
   at least one chip mounted on the first surface of the core layer and over the through hole, with a portion of the chip exposed via the through hole;
   a solder mask layer applied over the second surface of the core layer with the ball-bonding portions being exposed, wherein the solder mask layer is formed with an opening for exposing the through hole, the wire-bonding portions, and the intended-exposing regions;
   a plurality of bonding wires which penetrate through the through hole and electrically connect the chip to the wire-bonding portions;
   a first encapsulation body formed on the first surface of the core layer for encapsulating the chip;
   a second encapsulation body formed on the second surface of the core layer for encapsulating the bonding wires and the intended-exposing regions, wherein a thickness of the second encapsulation body covering the intended-exposing regions is substantially equal to that of the solder mask layer; and
   a plurality of solder balls deposited on the ball-bonding portions.

2. The WBGA semiconductor package of claim 1, wherein a width of the intended-exposing region is of a range from 0.2 to 0.8 mm.

3. The WBGA semiconductor package of claim 2, wherein the width of the intended-exposing region is 0.4 mm.

4. The WBGA semiconductor package of claim 1, wherein the intended-exposing regions are located adjacent to the wire-bonding portions.

5. The WBGA semiconductor package of claim 1, wherein the opening of the solder mask layer is larger in width than a mold cavity of a mold used for forming the second encapsulation body.

6. The WBGA semiconductor package of claim 1, further comprising: a layer of patterned conductive traces applied between the second surface of the core layer and the solder mask layer.

7. The WBGA semiconductor package of claim 1, further comprising: another solder mask layer applied between the first surface of the core layer and the chip.

8. A chip carrier used in a window ball grid array (WBGA) semiconductor package, comprising:
   a core layer having a first surface and an opposite second surface, and a through hole penetrating through the core layer;
   a conductive trace layer applied over the second surface of the core layer, and formed with a plurality of wire-bonding portions around the through hole, a plurality of ball-bonding portions, and a plurality of intended-exposing regions around the wire-bonding portions; and
   a solder mask layer applied over the conductive trace layer with the ball-bonding portions being exposed, and formed with an opening for exposing the through hole, the wire-bonding portions, and the intended-exposing regions.

9. The chip carrier of claim 8, wherein a width of the intended-exposing region is of a range from 0.2 to 0.8 mm.

10. The chip carrier of claim 9, wherein the width of the intended-exposing region is 0.4 mm.

11. The chip carrier of claim 8, further comprising: another solder mask layer applied over the first surface of the core layer.

12. A chip carrier used in a window ball grid array (WBGA) semiconductor package, comprising:
   a core layer having a first surface and an opposite second surface, and a through hole penetrating through the core layer;
   a conductive trace layer applied over the second surface of the core layer, and formed with a plurality of wire-bonding portions around the through hole, a plurality of ball-bonding portions, and a plurality of intended-exposing regions around the wire-bonding portions; and a solder mask layer applied over the conductive trace layer with the ball-bonding portion, being exposed, and formed with an opening for exposing the through hole, the wire-bonding portions, and the intended-exposing regions, wherein an encapsulation body in the semiconductor package for covering the intended-exposing regions is substantially equal in thickness to the solder mask layer.

13. The chip carrier of claim 12, wherein a width of the intended-exposing region is of a range from 0.2 to 0.8 mm.

14. The chip carrier of claim 13, wherein the width of the intended-exposing region is 0.4 mm.

15. The chip carrier of claim 12, further comprising: another solder mask layer applied over the first surface of the core layer.

* * * * *